(12) United States Patent
Landis et al.

(10) Patent No.: US 8,048,354 B2
(45) Date of Patent: Nov. 1, 2011

(54) METHOD OF FORMING SUPPORTS BEARING FEATURES, SUCH AS LITHOGRAPHY MASKS

(75) Inventors: Stephan Landis, Voiron (FR); Jean-Philippe Gouy, Quaix en Chartreuse (FR)

(73) Assignee: Commissariat a l'Energie Atomique, Paris (FR)

( * ) Notice: Subject to any disclaimer, the term of this patent is extended or adjusted under 35 U.S.C. 154(b) by 162 days.

(21) Appl. No.: 12/092,911

(22) PCT Filed: Nov. 9, 2006

(86) PCT No.: PCT/FR2006/002496
§ 371 (c)(1),
(2), (4) Date: May 7, 2008

(87) PCT Pub. No.: WO2007/054643
PCT Pub. Date: May 18, 2007

(65) Prior Publication Data
US 2008/0268351 A1 Oct. 30, 2008

(30) Foreign Application Priority Data
Nov. 9, 2005 (FR) ..................................... 05 11401

(51) Int. Cl.
*B29C 33/40* (2006.01)
(52) U.S. Cl. ......... 264/219; 264/293; 264/2.5; 264/497; 425/174.4; 425/375; 430/5; 430/394; 430/313
(58) Field of Classification Search .................. 264/293, 264/219, 2.5, 497; 425/385, 174.4, 375; 430/5, 394, 313
See application file for complete search history.

(56) References Cited

U.S. PATENT DOCUMENTS

| | | | | |
|---|---|---|---|---|
| 4,803,181 A | * | 2/1989 | Buchmann et al. | 438/696 |
| 4,814,244 A | * | 3/1989 | Koguchi et al. | 430/30 |
| 5,120,572 A | * | 6/1992 | Kumar | 216/16 |
| 6,180,290 B1 | | 1/2001 | Hsu et al. | |
| 6,713,231 B1 | * | 3/2004 | Hasegawa et al. | 430/311 |
| 7,018,783 B2 | * | 3/2006 | Iwasaki et al. | 430/321 |

(Continued)

FOREIGN PATENT DOCUMENTS
FR 2 869 601 A 11/2005

OTHER PUBLICATIONS
International Search Report, Mar. 19, 2007.
PCT Request in French.
PCT Written Opinion, Mar. 19, 2007.
French Search Report, Aug. 4, 2006.

(Continued)

*Primary Examiner* — Joseph Del Sole
*Assistant Examiner* — Nahida Sultana
(74) *Attorney, Agent, or Firm* — Brinks Hofer Gilson & Lione (57) ABSTRACT

To manufacture a support made of at least one predetermined material and bearing features: a plurality of superposed layers is produced on a substrate that it is known how to remove, each of the layers being formed from zones of at least two different materials, the geometry of the zones and the constituent materials of these superposed layers being defined so as to form said features, on the reverse side of the substrate, these features being of 3D type, and some of these features differing in height among themselves and/or with other features; a layer of the predetermined material is produced on this multilayer stack; and at least the substrate is eliminated whereby, after inversion, said support with said features is obtained.

23 Claims, 6 Drawing Sheets

U.S. PATENT DOCUMENTS

| | | | | |
|---|---|---|---|---|
| 7,405,033 | B2 * | 7/2008 | Yamazaki et al. | 430/311 |
| 7,559,758 | B2 * | 7/2009 | Landis et al. | 425/385 |
| 2002/0030800 | A1 | 3/2002 | Nellissen | |
| 2002/0187431 | A1 * | 12/2002 | Tanaka | 430/321 |
| 2005/0100828 | A1 | 5/2005 | Kim et al. | |
| 2005/0101051 | A1 * | 5/2005 | Uda et al. | 438/98 |
| 2005/0253296 | A1 * | 11/2005 | Landis et al. | 264/219 |
| 2006/0099521 | A1 * | 5/2006 | Park et al. | 430/5 |

OTHER PUBLICATIONS

Johnson et al., "Fabrication of mulit-tiered structures on step and flash imprint lithography templates", Microelectronic Engineering, vol. 67-68, Jun. 2003. XP004428873.

Wong, "Resolution Enhancement Techniques in Optical Lithography", Tutorial Texts in Optical Engineering, vol. TT47, pp. 117-152, 2001.

* cited by examiner

METHOD OF FORMING SUPPORTS BEARING FEATURES, SUCH AS LITHOGRAPHY MASKS

TECHNICAL FIELD OF THE INVENTION

The invention relates to a method of producing a support bearing one or more 3D patterns. The support, commonly used as a mask, can be transparent to visible light and/or ultraviolet light, for example, depending on the materials chosen. The support of the invention can thus be used as a mold to produce nano-imprint lithography patterns; in this case, the chosen material is in practice not transparent. The method is mainly concerned with nano-imprint lithography or optical (for example deep UV at wavelengths less than 248 nanometers) interferometric lithography. The method can also be used to produce phase-shift optical masks for optical lithography.

STATE OF THE ART

Figure 1:
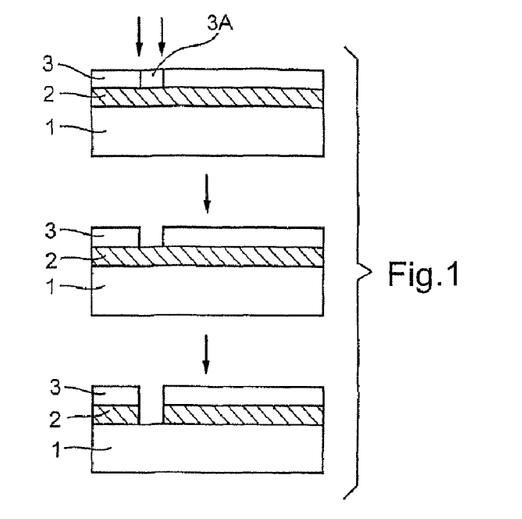
FIG. 1 is a diagram of a standard method of producing a transparent support having reflective portions and transparent portions.

FIG. 1 shows the standard method of fabricating transparent masks that can be used for step and flash nano-imprint lithography or optical lithography.

On a transparent support 1, advantageously of quartz when the mask is intended to be used at wavelengths greater than 193 nm, a metal, for example chromium, layer 2 is deposited in a first step. The metal layer locally eliminates the transparency of the support and also avoids charge effects during electronic lithography steps necessary for defining the patterns to be produced, A film 3 of photosensitive resin is then used to define patterns that will be transferred into the metal layer. To be more precise, radiation (vertical arrows) reaches only a portion 3A of the layer through a mask; a development process then eliminates only the portions of the photosensitive positive resin film that have been illuminated. Selective etching is then effected through the spaces 3A, while the areas covered by the resin 3 remain intact. A transparent support including reflective areas (where the metal layer remains) and transparent areas (where the metal layer has been eliminated by the aforementioned selective etching) is obtained in this way.

Figure 2:
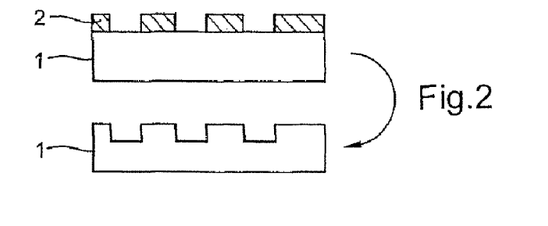
FIG. 2 is a diagram of a standard method of producing a transparent support comprising bosses and recesses.

If it is necessary to have a mask that is totally transparent but has a particular topography, the method described above can be used by transferring the patterns in the metal layer into the transparent material; FIG. 2 shows that, by etching the layer 1 through the mask consisting of the layer 2, the patterns of the layer 2 can be transferred into the layer 1 (in practice, these patterns are produced by the technique shown in FIG. 1); to obtain the required mask, it then suffices to eliminate the layer 2 (it does not need to be of metal as in FIG. 1 because it is intended to be eliminated before the mask is used). However, the technique imposes control of the etching of the quartz, for example using a chromium mask. The method is well known for patterns whose dimensions are several hundred nanometers. However, the use of this kind of process for dimensions less than 100 nm is much more difficult.

Moreover, the method described, and thus the standard microtechnology and nanotechnology techniques, provide no simple way to produce patterns in three dimensions, i.e. with a different height from pattern to pattern.

Figures 3, 4:
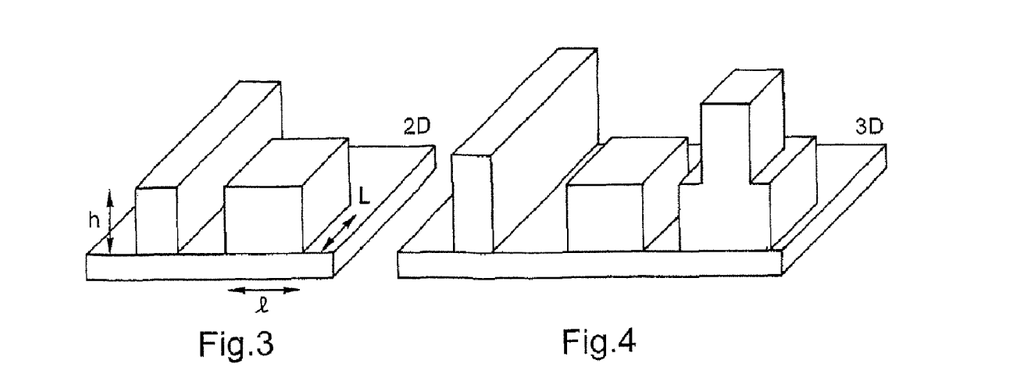
FIG. 3 is a diagram representing 2D type patterns in perspective.
FIG. 4 is a diagram representing 3D type patterns in perspective.

Comparison of FIGS. 3 and 4 shows the respective concepts of 2D patterns and 3D patterns; in FIG. 3, the two patterns represented have different dimensions L and l parallel to the support, but have equal heights; these patterns are of the 2D type. In contrast, in FIG. 4, the three patterns have different heights since the left-hand pattern is higher than the middle one but shorter than the right-hand one; furthermore, the right-hand pattern itself features height differences because it has lateral plateaus (here of the same height as the middle pattern); these patterns are of the 3D type.

Obviously supports having 2D structures, i.e. with parameters L or l differing from one pattern to another, but with exactly the same height h, can be produced easily, using the standard lithography and etching techniques shown diagrammatically in FIGS. 1 and 2. It is not impossible, using the same processes, to fabricate 3D structures (i.e. structures with a non-constant height), but sequencing the process steps becomes complicated and the associated constraints mean that not all required shapes can be produced with high geometrical accuracy.

It should be noted that, during an etching step, the etching rate is a function of the transverse dimensions and the density of the patterns to be etched (known as microloading), which is reflected in particular in the fact that, at a given time, the depth of etching is directly proportional to the transverse dimensions of the pattern to be etched; this phenomenon generates a loss of dimension of the patterns according to their height, which in practice is unacceptable.

Moreover, the etched structures in practice have substantial roughness at the bottom of the patterns.

Also, with resin patterns it is not always possible to decorrelate the dimensions in the plane and the height (original mask before transfer by etching). It can be shown that, if curves are plotted correlating the variations of dimensions for a negative resin pattern obtained by electronic lithography, on the one hand, and the associated height variations, on the other hand, as a function of the dose (the energy injected into the resin), the lateral dimension and the height vary simultaneously but differently, and so it is not possible to adjust one of the two variables without modifying the other one. Consequently, standard lithography cannot vary independently the dimensions l and L, on the one hand, and h, on the other hand.

FIGS. 3 and 4 show embossed patterns, but the above problems also arise in the production of recessed patterns.

TECHNICAL PROBLEM SOLVED BY THE INVENTION

An object of the invention is to produce supports featuring recessed or embossed patterns, the dimensions (or separations) whereof are less than approximately one hundred nanometers.

Another object of the invention is to produce, reliably and reasonably simply, supports carrying recessed or embossed 3D patterns.

A further object of the invention is to produce such supports provided with patterns of great dimensional accuracy, in width as well as in length and height, with a low roughness of the transverse surfaces.

To this end the invention proposes a method of fabricating a support in at least one predetermined material and including patterns, wherein a plurality of superposed layers is produced on a substrate that can be eliminated, each of the layers being formed of areas of at least two different materials, the geometry of the areas and the materials constituting the superposed layers being defined to form said patterns in reverse on the substrate, these patterns being of 3D type, some of these patterns having height differences within themselves and/or compared to other patterns, a layer of the predetermined material is produced on the stack of layers, and at least the substrate is eliminated, to obtain, after flipping, said support with said patterns.

Thus the invention teaches producing the patterns in reverse on a substrate that is finally eliminated, by stacking layers whose geometry is defined as a function of the patterns it is required to form on the support.

The superposed layers can advantageously be formed by:
cathode sputtering;
epitaxy;
electrolytic growth;
centrifugal deposition.

For the layer of the predetermined material, standard deposition techniques can be used (sputtering, electrolytic growth, molecular beam deposition, etc.) or more original techniques such as molecular bonding or centrifugal deposition of a fluid material that can solidify after one or more curing steps.

Thanks to the use of a succession of layers, the method of the invention provides great accuracy in the widthwise and lengthwise directions, authorizing dimensions of the order of only a few tens of nanometers.

Moreover, layer formation techniques are well proven, so that the height of the patterns can be closely controlled, independently of the lengthwise and widthwise accuracy. The required height can be obtained with great accuracy since it depends only on the deposition step (at this stage, the deposited thicknesses are controlled with an accuracy of the order of 0.1 nm) and not on the etching step. Because the dimensions (l, L) in the plane can be controlled well by the standard lithographic techniques, it is clear that, thanks to the method of the invention, the three dimensions (h, l and L) are controlled perfectly. The method of the invention therefore produces 3D patterns using simple and well proven lithography and etching processes well known to the person skilled in the art.

It is furthermore clear that low roughness can be obtained by stripping the surface of each layer. According to the invention, the etching steps involved in the formation of each layer are chosen as a function of their selectivity between the two families of materials used, without considering the resulting roughness, since the latter results essentially from the deposition conditions, because of the proposed succession of steps; deposition is a process that produces layers with very low roughness. In other words, the present invention, thanks to the concept of layers formed successively and stripped, leads to obtaining perfectly plane surfaces free of the roughness observed in etched structures.

Note that the layered structure avoids phenomena of different etching rates as a function of the transverse dimensions of the etched patterns (microloading).

It should be noted that the whole of the process is compatible with microelectronic and microtechnology processes because it uses techniques compatible with those processes.

Finally, the method of the invention can be used to prepare, at will, supports, molds, masks having an "embossed" or "recessed" topography. Consequently, it is possible to produce supports for resin masks with a background that is:
either dark, i.e. with few apertures in the resin mask obtained with a mold featuring bosses (which is equivalent to carrying out a standard lithography step with positive tonality resin),
or light, i.e. with many apertures in the resin mask obtained with a mold featuring recesses (which is equivalent to carrying out a standard lithography step with negative tonality resin).

The proposed technique for the fabrication of three-dimensional structures therefore provides very accurate control over the phase of the optical wave of a phase-shift mask in the smallest structure and also eliminates roughness phenomena.

In conclusion, the proposed method addresses the various points made hereinabove with regard to known solutions:
etching of the quartz on relatively thick (several hundred microns thick) substrates,
roughness of the bottom of the etched pattern, which compromises the quality of the transparent mask,
a simple way to produce three-dimensional patterns,
very accurate control of phase in the case of phase-shift masks,
the ability to produce "embossed" or "recessed" structures.

The aforementioned advantages stem from the general definition of the invention given hereinabove, or various advantageous features of the invention that can be proposed and where appropriate combined.

Thus the invention is clearly suitable for producing 2D patterns but, to obtain its full benefit, it is advantageous for said patterns to have differences of height.

Similarly, although the invention can be used regardless of the transverse dimensions of the patterns or the separation between them, to obtain its full benefit it is advantageous for at least some of the patterns, or at least some of the spaces between adjacent patterns, to have a dimension parallel to the support that is less than approximately 100 nanometers.

According to another advantageous feature, the materials constituting the superposed layers have different properties in relation to at least one kind of radiation, including at least a material substantially transparent to that radiation and a material absorbing that radiation, said patterns being delimited by interfaces between said materials within the layers. This corresponds to a mask whose exterior geometry can be limited by simple surfaces but that includes within it portions having differences in behavior vis àvis a given kind of radiation.

Nevertheless, in a particularly advantageous variant, at least one of the materials of the superposed layers is eliminated to form recessed and/or embossed patterns.

To be more precise, it is preferable if:
a selective elimination process is identified capable of attacking a first material and leaving a second material, which second material can be deposited on the first material, adhere thereto, and be etched,
at least one material is identified at least compatible with the first material, which can be deposited on the first material, adhere thereto, be etched and consumed by said selective elimination process,
at least one material is identified at least compatible with the second material, which can be deposited on these first and second materials, adhere thereto, be etched and not consumed by said selective elimination process,
a substrate formed of said first material is produced,
a patterning cycle is effected on the substrate so as to form on the substrate a first layer formed of areas of a material at least compatible with the first material and complementary areas of said second material,
at least one other patterning cycle is effected to form on the preceding layer another layer formed of areas of a material compatible with the first material and complementary areas of a material at least compatible with the second material, so as to form a stack of layers on the substrate,
the last layer of the stack is attached to a carrier layer,
said selective elimination process is used to eliminate the first material and the areas of material at least compatible with the first material so as to strip the stacked complementary areas of the second material or the material at least compatible with the second material, the carrier layer forming, with these complementary areas, the support carrying patterns.

In fact, the whole of the substrate can be formed by the first material or consist of a layer of this first material that is part of the substrate as such.

The patterning can be effected by deposition, etching and stripping.

The patterning techniques advantageously include:

optical and/or electronic lithography on a material sensitive to such radiation, followed by an etching step (these processes are well known to the person skilled in the art);

localized growth processes (growth of nodules by tunnel effect or atomic force microscopy, deposition on substrates having preferred growth sites such as "twisted substrates");

a combination of the foregoing two techniques.

According to preferred features of this particular method, where appropriate combined with each other:

a third material is identified for attaching or gluing the predetermined material of the support to the material at least compatible with the second material, an attachment layer of said third material is produced on said stack of layers, and the carrier layer of said predetermined material is produced on the attachment layer;

a process of molecular bonding, deposition by sputtering, electrolytic deposition or centrifugal deposition is used for this;

the design of at least one layer is different from the design of the preceding stage, whereby at least some of the patterns have differences of height perpendicularly to the support. This corresponds to referring to the patterns as of 3D type.

at least one of the patterning cycles includes stripping by physical or chemical polishing. This guarantees a low roughness of all transverse surfaces parallel to the support.

for patterns having embossed portions, there is identified in those embossed portions a stack of an upper edge and of at least one lower edge, the complementary areas of said first and other layers respectively having the shape of these upper and lower edges.

by analogy, if the patterns include recessed portions, there is identified in those recessed portions a stack of an upper edge and at least one lower edge, the areas of said first and other stages of a material at least compatible with the first material respectively having the shape of those upper and lower edges.

the predetermined material of the support is a material transparent to a given radiation. This corresponds to numerous applications of the support as a lithography mold or mask.

the predetermined material of the support is a material transparent to visible light, which corresponds to a first case of great practical importance.

alternatively, the predetermined material of the support is a material transparent to UV, which corresponds to another case of great practical importance.

the predetermined material of the support is quartz or fused silica.

the second material is thermal oxide and/or silica and the material at least compatible with the second material is silica and/or silicon oxide. These materials are well known and various etching techniques are known that leave them intact.

the first material and the material at least compatible with the first material essentially consist of silicon. This is also a material that is well known, including in combination with silica or silicon oxide in this case of selective etching.

in one particular case, the first material is monocrystalline silicon and the material at least compatible with this first material is polycrystalline or amorphous silicon. Another particular example of a material compatible with this first material (monocrystalline silicon) is silicon nitride or a silicon germanium alloy.

if the material to be eliminated consists essentially of silicon, the selective elimination process advantageously includes wet etching on oxide, for example of TMAH, KOH type. If the material to be eliminated is a silicon germanium alloy, dry CF4 etching can be used (/silicon and $Si_3N_4$ and $SiO_2$). For silicon nitride, a solution of $H_3PO_4$ can be used (/silicon and $SiO_2$).

alternatively, the first material and the material at least compatible with this first material are essentially formed of aluminum. This material is also well known to the person skilled in the art.

in the aforementioned case, the selective elimination process advantageously includes etching in a bath of $H_3PO_4$;

according to another variant, the first material and the material at least compatible with the first material consist essentially of chromium.

The invention also proposes diverse particular supports obtained by the aforementioned method, in particular:

a mold for nano-imprint lithography obtained by the method, this mold being formed of a support and printing patterns carried by that support, the materials constituting the support and the patterns being transparent to visible UV, DUV or EUV radiation; at least some of the patterns, or at least some of the separations between adjacent patterns, advantageously have a dimension parallel to the support that is between a few nanometers and a few micrometers.

an interferometric lithography mask obtained by the method, that mask being formed of a support and patterns carried by the support, the materials constituting the support and the patterns being transparent to UV radiation at wavelengths less than 248 nanometers; at least some of the patterns, or at least some of the separations between adjacent patterns, advantageously have a dimension parallel to the support that is of the order of a few tens of nanometers.

a phase-shift optical mask for optical lithography, obtained by the above method, that mask being formed of a support and patterns carried by the support, the materials constituting the support and some of these patterns being transparent to UV radiation whereas others of these patterns are of a material that reflects such radiation, and the support with its patterns having different thicknesses of transparent materials; at least some of the patterns, or at least some of the separations between adjacent patterns, advantageously have a dimension parallel to the support that is of the order of a few tens of nanometers.

DESCRIPTION OF THE INVENTION

Objects, features and advantages of the invention emerge from the following description given by way of illustrative and nonlimiting example with reference to the appended drawings, in which:

FIG. 17 is a view in section of a seventh and final step of fabrication of the support, FIG. 18 is a view of it from below.

With the aim of describing production methods as simply as possible, a few definitions are given first.

Material A: support compatible with "microelectronic" type microtechnology processes, for example a substrate of silicon, or silicon, silicon dioxide, silicon nitride, and more generally alloys based on silicon, even titanium nitride, aluminum, among others.

Material B: material chosen for its mechanical, optical, thermal or electrical properties, also compatible with "microelectronic" type microtechnology processes.

Material C: final support chosen for its mechanical, optical, thermal or electrical properties, a priori not necessarily compatible with "microelectronic" type microtechnology processes.

Material D: material chosen on the one hand for its mechanical, optical, thermal or electrical properties and, on the other hand, for its properties of transfer, attachment or even bonding to the material C. The material D is also compatible with "microelectronic" type microtechnology processes.

Selective elimination process: a process which physically or chemically removes the material A selectively without degrading the material B. A guarantee for the process adopted is the selectivity of the etching rate of the material B compared to the material A, which must be very high. The rate selectivity is ideally infinite. However, if this is not the case, account could be taken of the point in the original patterning and the sizes of the patterns modified to compensate for their attack by the selective removal process. The starting dimension is therefore equal to the targeted final dimension plus the erosion dimension caused by the selective shrinkage.

Material A': material compatible with "microelectronic" type microtechnology processes and having the same behavior as the material A in relation to the selective elimination process.

Material B': material chosen for its mechanical, optical, thermal or electrical properties, also compatible with "microelectronic" type microtechnology processes and having the same behavior as the material B in relation to the selective elimination process.

For example, to produce a support having patterns:

a selective elimination process capable of attacking a first material A and leaving a second material B is identified, the second material being able to be deposited on the first material, to adhere to it and to be etched, at least one material A' is identified at least compatible with the first material, i.e. able to be deposited on the first material, to adhere thereto, to be etched and to be consumed by said selective elimination process, at least one material B' at least compatible with the second material is identified, i.e. a material that can be deposited on the first and second materials, to adhere thereto, to be etched and not to be consumed by said selective elimination process, a third material D is identified for attaching or bonding the predetermined material C of the support onto the material at least compatible with the second material.

Obviously the concept of a material compatible with another material encompasses that other material (a material is compatible with itself).

Specifying that such and such a material is compatible with microtechnology processes in fact means that the material can withstand all the standard operations involved in such processes, in particular for depositing layers and patterning, but also subsequently in the event of heat treatment.

Two examples are described hereinafter, corresponding to supports having an embossed or recessed topography, but it is obvious that these concepts can easily be combined (a topography can include bosses and recesses at the same time).

Example of Production of a Support Having an "Embossed" Topography.

Figure 5:
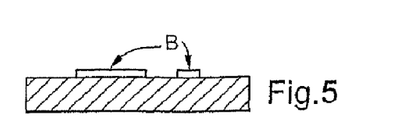
FIG. 5 is a view in section of a first step of fabrication of a support with "embossed" topography.
Figure 6:
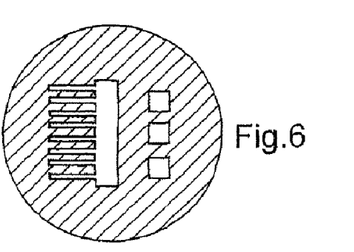
FIG. 6 is a view of it from above.

The material B (for example silica or silicon oxide deposited by CVD) is deposited on the material A, which is advantageously silicon. The material B then undergoes a step of patterning—lithography+etching+stripping—in order to produce 2D patterns of the material B on the material A (FIGS. 5 and 6).

Figure 7:
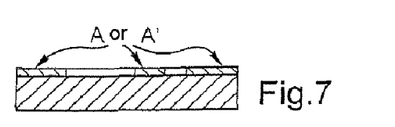
FIG. 7 is a view in section of a second step of fabrication of the support.
Figure 8:
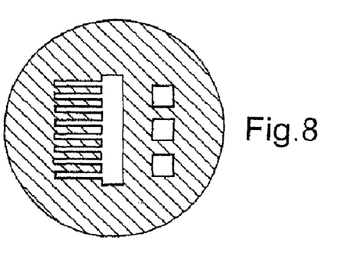
FIG. 8 is a view of it from above.

A material A or A' (polycrystalline or amorphous silicon is advantageously chosen) is then deposited on the structures produced previously. A step of planarization by chemical-mechanical polishing is effected, stopping at the material B, which thus appears at the surface (FIGS. 7 and 8).

Figure 9:
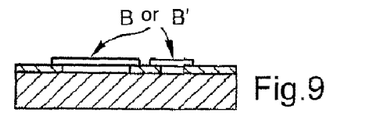
FIG. 9 is a view in section of a third step of fabrication of the support.
Figure 10:
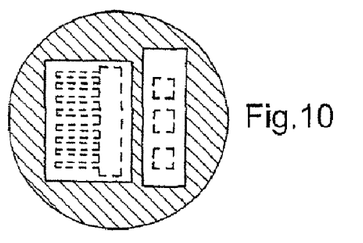
FIG. 10 is a view of it from above.
Figure 11:
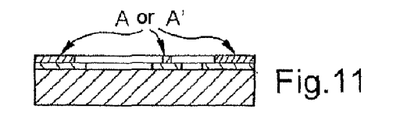
FIG. 11 is a view in section of a fourth step of fabrication of the support.
Figure 12:
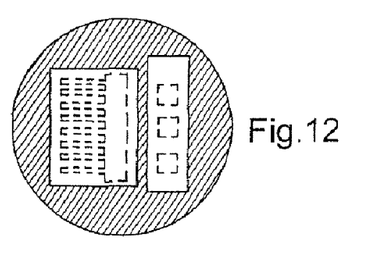
FIG. 12 is a view of it from above.

There is effected a further deposition and a further step of patterning of the material B or B' (FIGS. 9 and 10). Then deposition of the material A or A' with a planarization step is effected (FIGS. 11 and 12). The material B or B' therefore appears at the surface.

Figure 13:
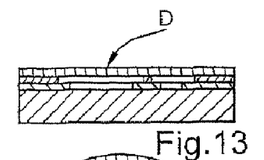
FIG. 13 is a view in section of a fifth step of fabrication of the support.
Figure 14:
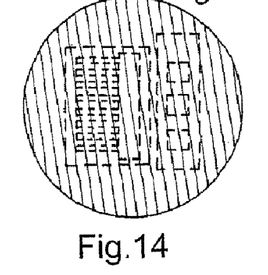
FIG. 14 is a view of it from above.
Figure 15:
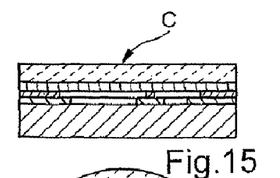
FIG. 15 is a view in section of a sixth step of fabrication of the support.
Figure 16:
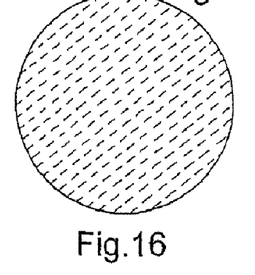
FIG. 16 is a view of it from above.

After a number of iterations necessary for producing the three-dimensional structure (deposition and patterning of the material B or B', with deposition, etching and planarization of the material A or A'), the material D (silica, silicon oxide) is deposited (FIGS. 13 and 14). A material C (quartz or fused silica, for example) is then deposited. The thickness of the material is advantageously chosen to provide the optical, mechanical, thermal, etc. properties necessary for the use of the support so produced (FIGS. 15 and 16).

The process ends with a selective elimination step that retains only the material B or B' on the layer D and C, the material A having been totally eliminated (FIGS. 17 and 18). Chemical-mechanical polishing can be used for this, finishing with selective etching of silicon (material A or A') on oxide (material B or B', D) of TMAH (tetramethyl ammonium hydroxide) type.

There is obtained in this way a support produced in material C on which embossed patterns in material B (or B') appear.

Example of Production of a Support Including a "Recessed" Topography.

Figure 19:
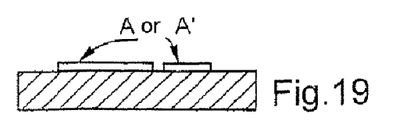
FIG. 19 is a view in section of a first step of fabricating a support with a "recessed" topography.
Figure 20:
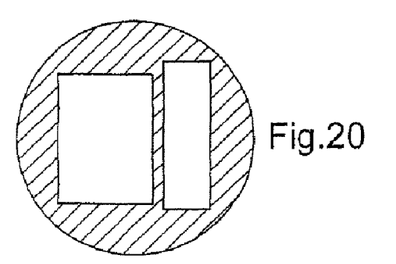
FIG. 20 is a view of it from above.

The material A or A' (for example silicon) is deposited on a substrate which is advantageously of the same kind (material A). The material A then undergoes a patterning step (lithography+etching+stripping) in order to produce 2D patterns in material A on the substrate (FIGS. 19 and 20).

Figure 21:
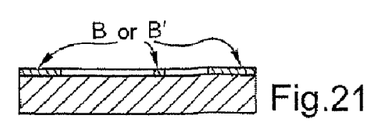
FIG. 21 is a view in section of a second step of fabrication of the support.
Figure 22:
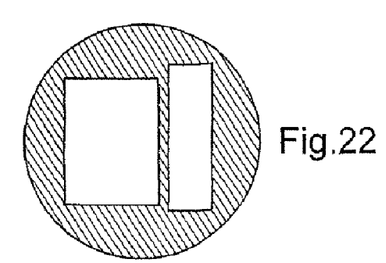
FIG. 22 is a view of it from above.

A material B or B' (for example silicon oxide) is then deposited on the structures previously produced. A step of planarization by chemical-mechanical polishing is effected, stopping at the material A, which therefore appears at the surface (FIGS. 21 and 22).

Figure 23:
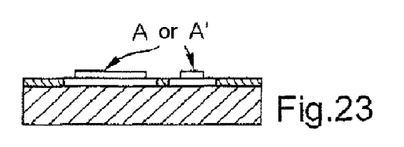
FIG. 23 is a view in section of a third step of fabrication of the support.
Figure 24:
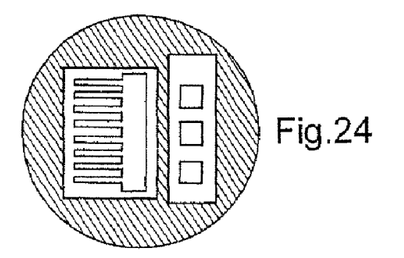
FIG. 24 is a view of it from above.
Figure 25:
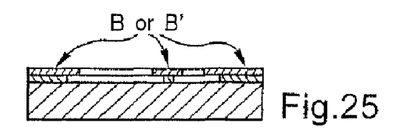
FIG. 25 is a view in section of a fourth step of fabrication of the support.
Figure 26:
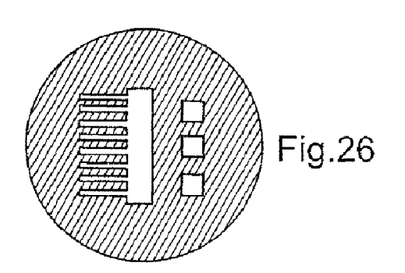
FIG. 26 is a view of it from above.

There follow further deposition and a further step of patterning the material A or A' (FIGS. 23 and 24). Then the material B or B' is deposited with a planarization step (FIGS. 25 and 26). The material A or A' therefore appears at the surface.

Figure 27:
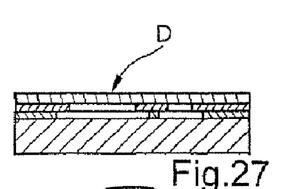
FIG. 27 is a view in section of a fifth step of fabrication of the support.
Figure 28:
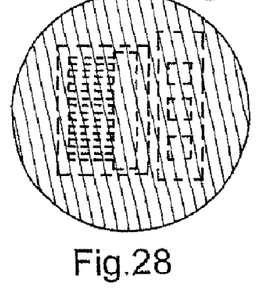
FIG. 28 is a view of it from above.
Figure 29:
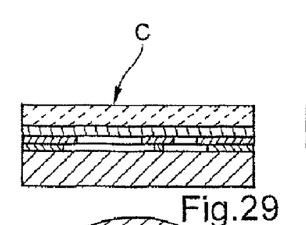
FIG. 29 is a view in section of a sixth step of fabrication of the support.
Figure 30:
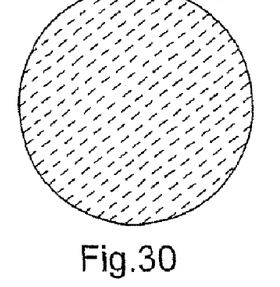
FIG. 30 is a view of it from above.

After a number of iterations necessary for the production of the three-dimensional structure (deposition and step of patterning of the material A or A' and deposition and planarization of the material B or B'), the material D (silica, silicon oxide) is deposited (FIGS. 27 and 28). A material C (quartz, fused silica) is then deposited (FIGS. 29 and 30). The thickness of the material is advantageously chosen to provide the optical, mechanical, thermal and other properties necessary for the use of the support so produced.

Figure 31:
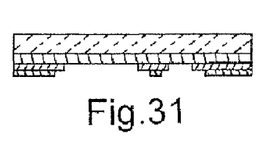
FIG. 31 is a view in section of a seventh and final step of fabrication of the support.
Figure 32:
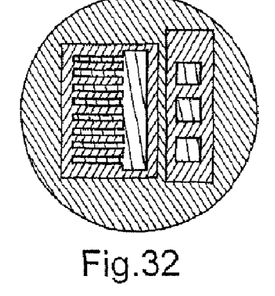
FIG. 32 is a view of it from below.

The process ends with a selective elimination step which retains only the material B or B' on the layer D and C, the material A or A' having been totally eliminated (FIGS. 31 and 32). Chemical-mechanical polishing can be used ending with selective etching of silicon (material A or A') on oxide (material B or B', D) of TMAH type.

The process can be used to fabricate molds on quartz or fused silica for nano-imprint lithography (NIL) in a step and flash configuration. The technique uses a mold transparent to UV radiation for the transformation of polymers, under the mold, during the pressing operation. Consequently, the table below proposes a configuration easily usable in a microelectronic type environment.

| | |
|---|---|
| Material A | Silicon substrate |
| Material A' | Polysilicon or amorphous silicon |
| Material B | Silica—Thermal or CVD oxide $SiO_2$ |
| Material B' | Silica—Silicon oxide deposited by CVD (HTO high temp or TEOS low temp) |
| Material C | Quartz or fused silica substrate |
| Material D | Silica—Silicon oxide deposited by CVD (HTO high temp or TEOS low temp) |
| Selective elimination process | Chemical-mechanical polishing ending with selective etching of silicon on oxide of TMAH type |

In the aforementioned table, CVD stands for Chemical Vapor Deposition.

To produce diffraction gratings with largely submicron dimensions (a few tens of nanometers) on fused silica for deep UV optical interferometry applications, the materials B, B' and C must be transparent to DUV radiation (wavelength less than 248 nm). The table below summarizes the possible choices for the various materials.

| | |
|---|---|
| Material A | Silicon substrate |
| Material B | Thermal oxide $SiO_2$ |
| Material C | Fused silica substrate |
| Material D | Silica—Silicon oxide deposited by CVD (HTO high temp or TEOS low temp) |
| Selective elimination process | Chemical-mechanical polishing ending with selective etching of silicon on oxide of TMAH type |

Obviously materials other than silicon can be used for the material A. For example, aluminum is totally compatible with the process. It suffices to use a bath of $H_3PO_4$ to eliminate the material selectively without affecting the shaped transparent material.

Chromium can also be used and removed using the chrome etch solution well known to the person skilled in the art.

Typically, four advantageous configurations can be produced with the present process:

a configuration with a transparent support in which are embedded absorbent patterns of 2D type (FIG. 33); the configuration can be used for an optical mask in particular, a configuration with an entirely transparent support with recesses which can be of 3D type (FIG. 34); the configuration can be used in particular for optical masks or transparent molds for step and flash nano-imprint lithography, a configuration with a transparent support in which are embedded opaque patterns of 3D type (FIG. 35); the configuration can be used in particular for optical masks, a configuration with a non-transparent support with recesses that can be of 3D type; the configuration can be used in particular for hot embossing, better known as nano-imprint lithography.

Figure 33:
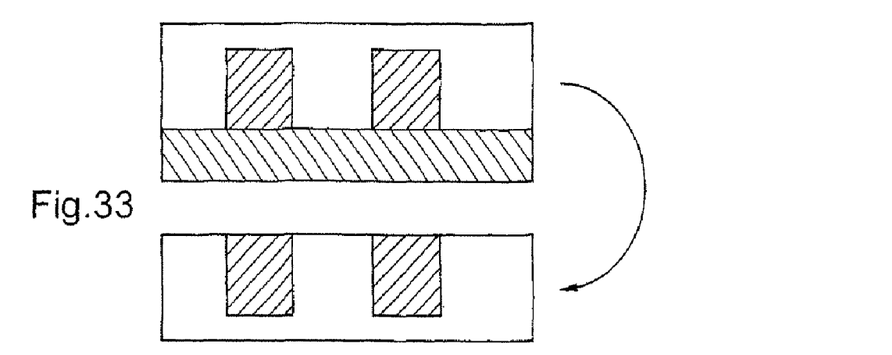
FIG. 33 is a view in section of a first configuration of an optical mask with opaque patterns for interferometric lithography.
Figure 34:
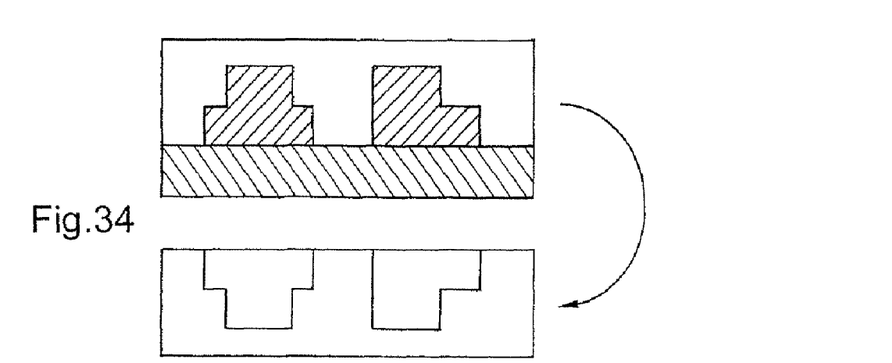
FIG. 34 is a view in section of a second configuration of a transparent optical mask with recessed patterns for interferometric or nano-imprint lithography.
Figure 35:
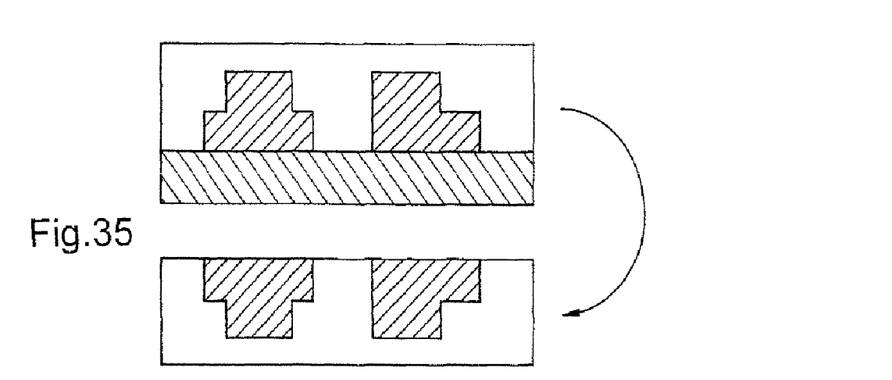
FIG. 35 is a view in section of a third configuration of an optical mask with 3D opaque patterns.

Note that in the first and third configurations the final support is delimited by plane upper and lower surfaces, the patterns being delimited by interfaces between the constituent materials.

Applications of supports that can be obtained by means of the invention already referred to include molds for nano-imprint lithography and optical interferometric lithography masks; phase-shift optical masks for optical lithography can also be mentioned.

Application to the Fabrication of a Phase-Shift Mask.

The process as described above can easily be adapted for the fabrication of phase-shift masks.

Figure 36:
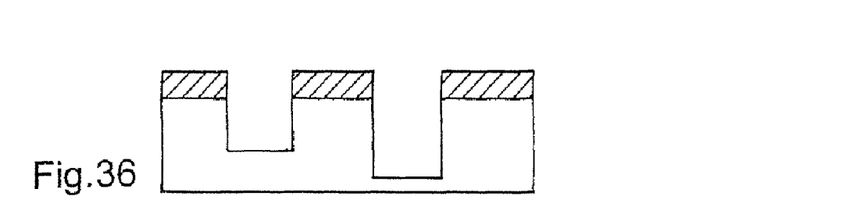
FIG. 36 is a view in section of a phase-shift mask.

FIG. 36 shows the principle of phase-shift masks, with a transparent support having recesses of varying depth separated by projecting portions ending in opaque portions.

Different transparent portions of the mask do not have the same thickness, the consequence of which is to modify the optical is path of the light beam through the mask. The technology very significantly increases the resolution that can be achieved with optical photolithography equipment [see "Resolution Enhancement Techniques" in Optical Lithography, A. K. Wong, 2001, SPIE Press] compared to using a binary mask, i.e. a mask including only opaque and transparent areas, all the same thickness. Different types of phase-shift mask exist. The table below summarizes the various possibilities that exist.

| Type of phase | Alternate name | Category | Applicable structure |
| --- | --- | --- | --- |
| Alternating | Levenson | Strong | Grouped lines and spaces |
| Rim shift | | Weak | Contacts, isolated features |
| Attenuated | Leaky chrome, half-tone | Weak | Contacts, isolated features |
| Phase-edge | Chromeless | Strong | Narrow lines |
| Outrigger | Subresolution | Weak | Isolated features |

Figure 37:
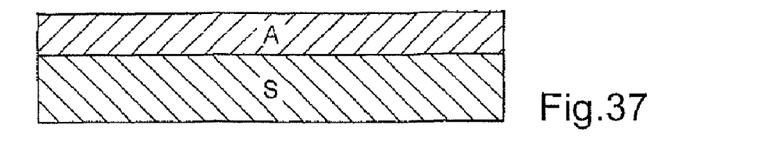
FIG. 37 is a view in section of a first step of fabrication of a phase-shift mask.
Figure 38:
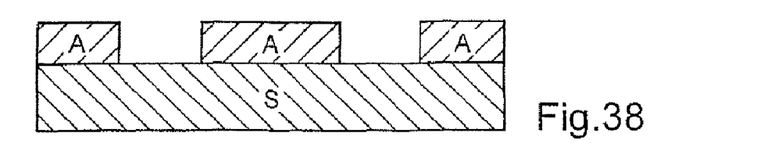
FIG. 38 is a view in section of a second step thereof.
Figure 39:
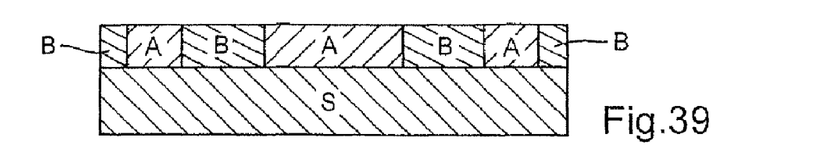
FIG. 39 is a view in section of a third step thereof.
Figure 40:
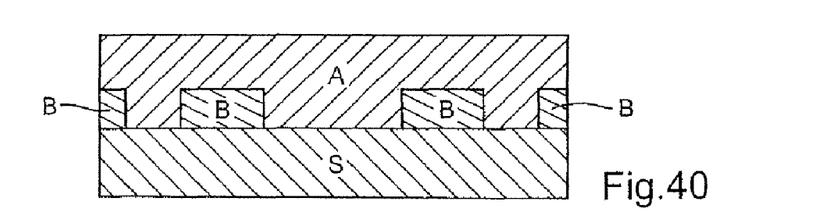
FIG. 40 is a view in section of a fourth step thereof.
Figure 41:
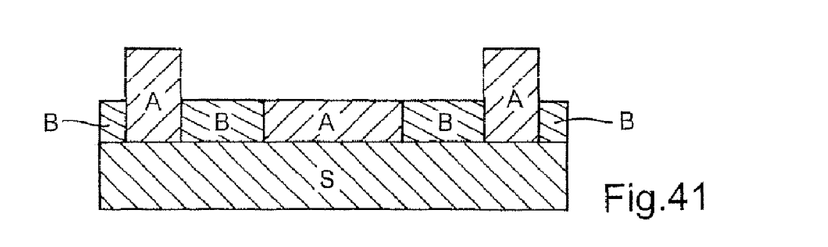
FIG. 41 is a view in section of a fifth step thereof.
Figure 42:
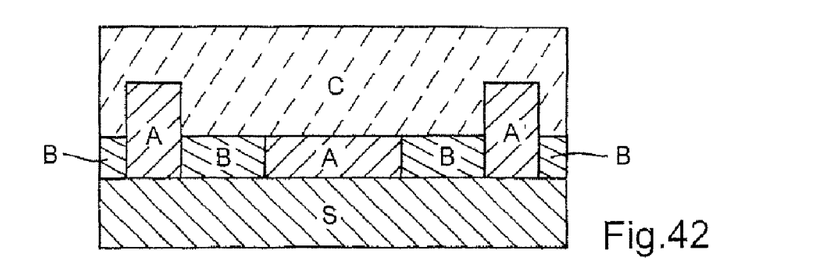
FIG. 42 is a view in section of a sixth step thereof.
Figure 43:
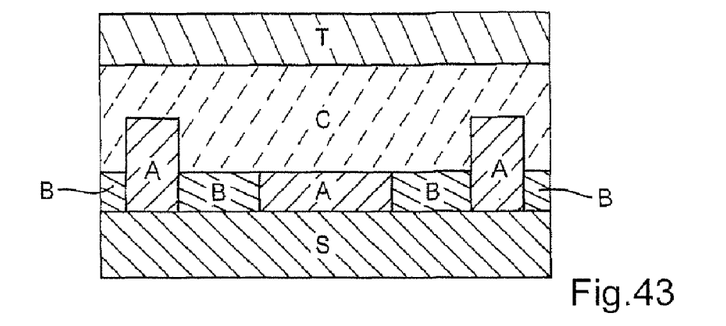
FIG. 43 is a view in section of a seventh step thereof.
Figure 44:
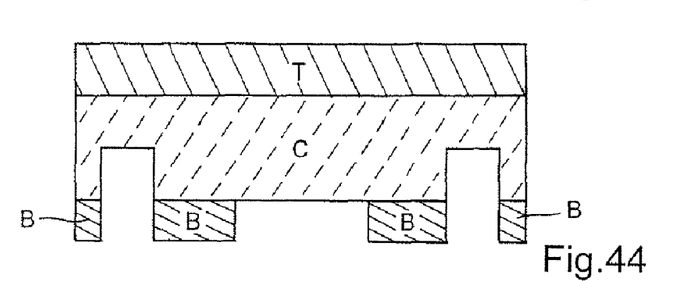
FIG. 44 is a view in section of a eighth step thereof.

The method of the present invention can produce any of these phase-shift mask families. For example, for alternating masks for which etching of the transparent material (typically doped silica) is necessary, the steps are as follows:

With the present process, the steps are as follows:
step 1: a layer A is deposited on the substrate of material A (FIG. 37),
step 2: lithography (to form a mask) followed by etching of the layer A (FIG. 38),
step 3: deposition of the (opaque) material B and planarization to leave the etched layer A flush (FIG. 39),
step 4: deposition of a complementary layer A (FIG. 40),
step 5: lithography followed by etching of the second layer of material A (FIG. 41),
step 6: deposition of the (transparent) material C and planarization (FIG. 42),
step 7: bonding of the layer C that will support the material B on a transparent substrate T (FIG. 43),
step 8: elimination of the substrate and the material A (FIG. 44).

Figure 45:
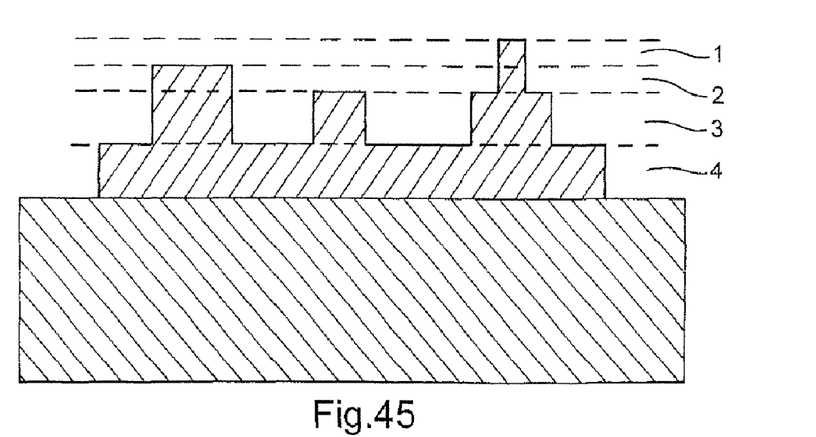
FIG. 45 is a theoretical diagram showing the fabrication of a support with an embossed topography.
Figure 46:
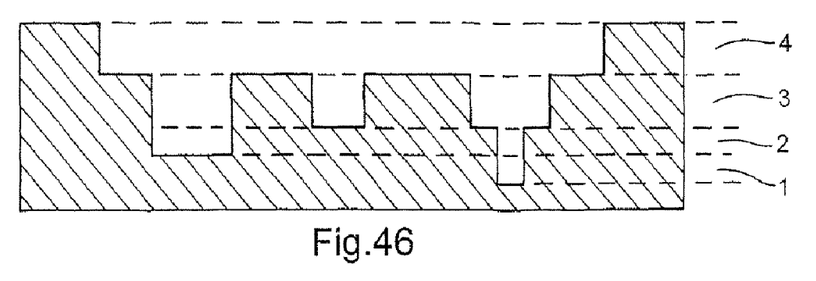
FIG. 46 is a theoretical diagram showing the fabrication of a support with an recessed topography.

FIGS. 45 and 46 indicate by way of example the analysis that can be done of a support provided with patterns to be fabricated in accordance with the invention.

In FIG. 45, which represents a support provided with "embossed", i.e. projecting, patterns, the first step is to identify the horizontal planes in which there is a change of shape of at least one of the patterns: the spaces between these planes indicate the layers that must be distinguished when fabricating the support concerned: there is thus at least one layer 1 for forming the upper portion of the right-hand pattern, then a layer 2 for forming the downward remainder of the right-hand pattern and the upper portion of the left-hand pattern, then a layer 3 for the base of each of the three patterns (note that the middle pattern has the same height as the base of the right-hand pattern), then a layer 4 for the base common to these three patterns. The fabrication process produces first the layer 1, then the layer 2, then the layer 3, then the layer 4 in reverse on a support.

The procedure is analogous with the support from FIG. 46 whose topography is recessed.

It should be noted that the invention achieves very good control over the dimensions of the patterns produced (both in width and in height), with sharp edges, which proves to be very difficult using known techniques, and this without limitation as to the nature (chemical composition, hardness, geometrical stability in service, ability to be covered effectively with a coating such as a non-stick coating in the case of a mold, etc.) of the materials used, which can therefore be chosen as a function of their future functions (in particular characteristics of transparency to particular kinds of radiation, heat resistance, mechanical strength, etc.); in particular, the invention produces patterns totally transparent to radiation such as UV. Moreover, it eliminates problems linked to etching quartz (in particular because of the correlation between the width and the depth of the etched areas) when 3D objects transparent to UV are to be produced, for example. Similarly, it avoids the formation of etch stop layers, which could not accurately produce the various height levels required with great accuracy anyway.

It should also be noted that the invention produces objects in which patterns have been formed without necessarily eliminating some of the stacked layers: thus the invention can form opaque patterns surrounded by a material transparent to a given radiation (for example UV).

It should further be noted that the invention can combine a number of materials within the support carrying the patterns, whether the patterns are (in whole or in part) of a material different from that of the support, whether some of the patterns are in one (or more) material(s) different from that (or those) of other patterns. For example, by choosing the material B' and the material B appropriately in the stack of layers described with reference to the figures, there can be produced within the patterns strata of different materials, in order in particular to obtain different transparency or thermal effects; alternatively, some patterns can be produced in the material B and other patterns in the material B'; of course, the foregoing description refers to two different materials, but clearly there can be a greater number of materials B, B', B", etc. provided that those materials comply with the conditions set out in the definition given hereinabove of what constitutes a material B'. Furthermore, by choosing materials B and B' different from the material C of the support, it is possible, for example, to form patterns in a material having a negative coefficient of thermal expansion (unlike the support), so that hot imprinting can produce patterns having geometries smaller than those with which the patterns are produced; this achieves a better resolution for the imprinted patterns than that with which the patterns of the mold are produced. Alternatively, an appropriate choice of the various coefficients of thermal expansion can facilitate extraction from the mold. The support itself can even be made from more than one material (C, C', etc.) should that appear beneficial. Generally speaking, the possibility of choosing the various material B and B' (or even B", etc.) and C optimizes the constraints, in particular thermal and mechanical constraints, that the object produced by the invention may be required to comply with.

The invention claimed is:

1. A method of fabricating a mold for nano-imprint lithography comprising a support in at least one predetermined material and including patterns, the method comprising:
producing a plurality of superposed layers on a substrate that can be eliminated, each of the plurality of layers comprising areas of at least two different materials, wherein the geometry of the areas and the materials comprising the plurality of superposed layers are defined to form the patterns in reverse on the substrate, the patterns comprising 3D patterns, wherein a portion of the patterns have height differences within an individual pattern or with respect to other patterns;
producing a layer of the predetermined material on the superposed layers, and
eliminating at least the substrate, wherein
the method further comprises eliminating at least one of the materials of the superposed layers to form recessed or embossed patterns or both.

2. The method according to claim 1, wherein the patterns project.

3. The method according to claim 1, wherein at least a portion of the patterns, or at least a portion of separations between adjacent patterns, have a dimension parallel to the support that is less than approximately 100 nanometers.

4. The method according to claim 1, wherein the materials comprising the superposed layers have different properties in relation to at least one radiation, of which at least one material is substantially transparent to the radiation and one material is absorbent to the radiation, wherein the patterns are delimited by interfaces, within the layers, between the materials.

5. The method according to claim 1 further comprising:
identifying a selective elimination process capable of attacking a first material and leaving a second material, where the second material can be deposited on the first material, adhere thereto, and be etched;
identifying at least one material that is at least compatible with the first material and that can be deposited on the first material, adhere thereto, be etched and be consumed by the selective elimination process;
identifying at least one material that is at least compatible with the second material and that can be deposited on the first and second materials, adhere thereto, be etched and not be consumed by the selective elimination process;
producing a substrate formed of the first material;
patterning the substrate so as to form on the substrate a first layer comprising areas of the material at least compatible with the first material and complementary areas of the second material;
performing at least one additional patterning to form on an underlying layer another layer comprising areas of the material compatible with the first material and complementary areas of the material at least compatible with the second material, so as to form a stack of layers on the substrate;
attaching an uppermost layer of the stack to a carrier layer;
selectively eliminating the first material and the areas of the material at least compatible with the first material so as to strip the stack of complementary areas of the second material or of the material at least compatible with the second material, wherein a carrier layer is formed, with the complementary areas, and the support is provided with patterns.

6. The method according to claim 5, wherein the patterning comprises deposition, etching and stripping.

7. The method according to claim 5 further comprising identifying a third material for attaching or gluing the predetermined material of the support to the material at least compatible with the second material, producing an attachment layer of the third material on the stack of layers, and producing the carrier layer of the predetermined material on the attachment layer.

8. The method according to claim 5, wherein performing at least one additional patterning differs from the patterning of the underlying layer, such that at least some of the patterns have height differences perpendicular to the support.

9. The method according to claim 5, wherein at least one of the patterning cycles further comprises stripping by chemical or physical polishing.

10. The method according to claim 5, wherein, the patterns including embossed portions comprising a stack of an upper edge and at least one lower edge, the complementary areas of said first and other layers having the shape of these upper and lower edges, respectively.

11. The method according to claim 5, wherein, the patterns including recessed portions comprising a stack of an upper edge and at least one lower edge, the areas of the first and other materials at least compatible with the first material having the shape of the upper and lower edges, respectively.

12. The method according to claim 5, wherein the predetermined material of the support comprises a material transparent to a given radiation.

13. The method according to claim 12, wherein the predetermined material of the support comprises a material transparent to visible light.

14. The method according to claim 12, wherein the predetermined material of the support comprises a material transparent to UV.

15. The method according to claim 12, wherein the predetermined material of the support comprises quartz.

16. The method according to claim 12, characterized in that the predetermined material of the support comprises fused silica.

17. The method according to claim 5, wherein the second material comprises silica or thermal oxide or a combination of silica and thermal oxide and the material at least compatible with the second material comprises silica or silicon oxide or a combination of silica and silicon oxide.

18. The method according to claim 5, wherein the first material and the material at least compatible with the first material consist essentially of silicon.

19. The method according to claim 18, wherein the first material comprises monocrystalline silicon and the material at least compatible with the first material comprises polycrystalline or amorphous silicon, silicon nitride or a silicon-germanium alloy.

20. The method according to claim 18, wherein the selective elimination process comprises wet etching on oxide of TMAH or KOH type.

21. The method according to claim 5, wherein the first material and the material at least compatible with the first material consist essentially of aluminum.

22. The method according to claim 21, wherein the selective elimination process comprises etching by an $H_3PO_4$ bath.

23. The method according to claim 5, wherein the first material and the material at least compatible with the first material consist essentially of chromium.

* * * * *